United States Patent
Porowski et al.

(10) Patent No.: US 6,399,500 B1
(45) Date of Patent: Jun. 4, 2002

(54) MECHANO-CHEMICAL POLISHING OF CRYSTALS AND EPITAXIAL LAYERS OF GAN AND $GA_{1-X-Y}Al_XIN_YN$

(75) Inventors: Sylwester Porowski; Izabella Grzegory, both of Warsaw (PL); Jan Weyher, Malden (NL); Grzegorz Nowak, Warsaw (PL)

(73) Assignee: Centrum Badan Wysokocisnieniowych Pan, Warsaw (PL)

( * ) Notice: Subject to any disclaimer, the term of this patent is extended or adjusted under 35 U.S.C. 154(b) by 0 days.

(21) Appl. No.: 09/402,692

(22) PCT Filed: Mar. 13, 1998

(86) PCT No.: PCT/PL98/00010

§ 371 (c)(1),
(2), (4) Date: Nov. 19, 1999

(87) PCT Pub. No.: WO98/45511

PCT Pub. Date: Oct. 15, 1998

(30) Foreign Application Priority Data

Apr. 4, 1997 (PL) .............................................. P319329

(51) Int. Cl.$^7$ ......................... H01L 21/302; B44C 1/00; C25F 1/00
(52) U.S. Cl. .......................... 438/692; 438/693; 216/88; 216/89; 134/1.3
(58) Field of Search ................................ 438/692, 693; 216/88, 89; 134/1.3

(56) References Cited

PUBLICATIONS

Weyher J L et al: "Chemical Polishing of Bulk and Epitaxial GaN" Journal of Crystal Growth, vol. 182, No. 1–2, Dec. 1977, p. 17–22 XP004100368 see p. 18, Left–Hand Column, Paragraph 2–Paragraph 3.

Perlin P et al: Spatial Distribution of Electron Concentration and Strain in Bulk GaN Single Crystals–Relation to.

Growth Mechanism III–V Nitrides, Symposium, III–V Nitrides, Symposium, Boston, MA, USA, Dec. 2–6, 1996, 1997, Pittsburgh, Pa. USA, Mater. Res. Soc, USA, pp. 519–524, XP002069652.

Minsky M S et al: "Room Temperaure Photoenhanced Wet Etching of GaN" Applied Physics Letters, Mar. 11, 1996, AIP, USA, vol. 68, No. 11, ISSN 0003–6951, pp. 1531–1533, XP002069653.

Ponce F A et al: "Homoepitaxy of GAN on Polished Bulk Single Crystals by Metalorganicchemical Vapor Deposition" Applied Physics Letters, vol. 68, No. 7, Feb. 12, 1996, pp. 917–919, XP000559960 see p. 917, Right–Hand Column, Paragraph 2.

*Primary Examiner*—George Goudreau
(74) *Attorney, Agent, or Firm*—Horst M. Kasper

(57) ABSTRACT

This method of removal of irregularities and highly defected regions of the surface of crystals and epitaxial layers of GaN and $Ga_{1-x-y}Al_xIn_yN$ characterized by mechano-chemical polishing on the soft polishing pad under pressure in presence of chemical etching agent of water solution of bases of the total concentration above 0.01N in time longer than 10 seconds after which the agent is replaced by the pure water without interruption of the polishing and polishing by at least 1 minute aid subsequent diminution of the load and stopping of the machine and then the polished GaN crystal or GaAlInN epitaxial layer is removed of the polishing machine and dried in the stream of dry nitrogen.

6 Claims, No Drawings

MECHANO-CHEMICAL POLISHING OF CRYSTALS AND EPITAXIAL LAYERS OF GAN AND $GA_{1-X-Y}Al_XIN_YN$

FIELD OF THE INVENTION

This invention relates to the method of mechano-chemical polishing crystals and epitaxial layers of GaN and GaAlInN in order to remove of irregularities and highly defected regions from the surface of crystals and epitaxial layers of GaN and $Ga_{1-x-y}Al_xIn_yN$ used in manufacturing of optoelectronic devices.

BACKGROUND OF THE INVENTION

There are well known methods of preparation of the surface of substrates of single GaN crystals for homoepitaxy based on polishing by diamond micropowder and high temperature annealing in the atmosphere of ammonia and hydrogen gas mixture. The micropowder polishing leads creation of the surface with ridges of the height of several atomic layers with the of the depth of order of 200 A i.e. about 100 interatomic distances. The annealing in ammonia and hydrogen gas mixture do not remove the scratches despite some change of the surface structure.

The flaw of diamond micropowder polishing and annealing method is creation of highly defected surface which leads to important disturbances of the growth of epitaxial layers.

There are also well known methods of removal of surface irregularities of other crystals by polishing on the soft pads in presence of chemical etching substances not being the water solution of the concentration higher than 0.01 so called mechano-chemical polishing. The mechano-chemical polishing process proceeds via creation of a thin layer of soft reaction product which is removed by soft pad polishing.

OBJECT AND SUMMARY OF THE INVENTION

One object of the Invention is the method of removal of surface irregularities and highly defected regions from the surface of crystals and epitaxial layers of GaAlInN by polishing on soft pad in presence of base water solution of the concentration above 0.1 during 10 second and subsequent replacement of the solution by pure water and polishing by at least 1 minute. Subsequently the pressure exerted on the sample is diminished and the polishing machine is stopped and the polished GaAlInN crystal is removed in a well known method under the flow of dry nitrogen. As a chemical etching agent the water solutions of the bases such as sodium base NaOH, potassium base KOH or their mixtures. The polishing is effected on a soft pad in presence of etching agent and water under the pressure of 0.01 MPa and using angular velocity of 1 to 100 revolutions per minute. The polishing in the presence of etching agent is effected with the continues adding of etching agent with the rate of 1–5 droplets per second. The water polishing is effected with continues adding the pure water with the rate higher than 1 droplet for second. The advantage of the Invention is a possibility of yielding of atomically smooth large area surfaces of crystals and epitaxial layers of GaAlInN. The crystals with so prepared surfaces are the optimal substrates for homoepitaxy of thin layers and highest quality electronic structures. The method of the Invention will not lead to creation of flat layer of the reaction product but the etching ot the surface into the sharp edged pyramidal structure. The polishing according to the Invention will lead to abrasion of the pyramids created in the etching process because local strain on the sharp edges considerably overcomes the nominal value of the pressure. The method of the Invention is simple and can be used in room temperature. The chemical etching agents are easy to prepare, and non-toxic.

The subject of the Invention s demonstrated on the examples of applications.

EXAMPLE I

GaN hexagonal plate-like crystals, obtained by growth from the nitrogen solution in liquid gallium under high $N_2$ pressure are prepared in the method described by the Invention. The hexagonal surfaces of the crystals correspond to crystallographic (0001) planes of wurtzite structure. In order to use the surface of the crystal as a substrate for the growth of thin homoepitaxial layer it is necessary the surface is atomically smooth. Initially the surface is polished mechanically using diamond micropowder to the smoothness of several interatomic distances. So smooth areas are between the scratches of the depth of order of 100 interatomic distances. Moreover the polishing leads to creation of several micron thick, neighboring layer of highly defected crystal of high dislocation density. The surface of the crystal is then polished according to the invention. GaN crystal is the located in the holder of polishing machine equipped with the polishing pad covered with the soft polishing cloth Politex Supreme type. The 5-n water solution of KOH is injected into the batch meter. The polishing cloth is saturated with the etching solution. The rotating pad is set into the motion with the velocity equal to 20 revolutions per minute and brought into the contact with the crystals with adding the load so that the nominal pressure on the crystal surface is 0.3 MPa. The polishing proceeds during 20 minutes with the continuous adding of chemical agent on the polishing cloth with the rate of 1 droplet per second. After 20 minutes the chemical agent is replaced by water without interruption of the polishing. The polishing is continued for 60 minutes with the gradual adding of the water with the rate of 2 droplet for second and subsequently the load is diminished and the machine is stopped. The holder with the crystal s removed is dried in the tream of dry nitrogen in well know way.

EXAMPLE II

In this example of removal of irregularities by the procedure described in the Invention will be used for the surface of heteroepitaxial layer of the nominal thickness of 0.6 micron, obtained by MOCVD deposition of GaN on sapphire substrate. The layer is covered by hexagonal hillocks of the height up to 0.2 micron resulting from the higher growth velocity in the neighborhood of screw dislocation.

The substrate with the deposited layer is located in the holder of polishing machine, equipped with the rotating pad, covered with the polishing cloth of Pellon type. The 2-n water solution of sodium base NaOH is injected in the batch meter. The polishing cloth is saturated with the etching agent. The pad is set into the motion with the velocity equal to 30 revolutions for minute and brought into the contact with the crystal adding the load so that the nominal pressure on the crystal surface is equal to 0.1 MPa. The polishing last 3 minutes with the continous addition of chemical etching agent on the polishing pad with the rate of 1 droplet for second. After 3 minutes the etching agent is replaced by pure water without interruption of the polishing. The polishing is continued for 80 minutes adding the water with the rate of 2 droplet for second, then the load is diminished and the polishing machine is topped.

APPLICATION

The method can be applied in the manufacturing of electronic and optoelectronic devices. In particular this can be used in fabrication of light emitting diodes (LEDs) and laser diodes (LDs) active in green, blue and ultraviolet range of spectrum. The electronic application include fabrication of high power/high frequency devices capable to work in high temperatures.

We claim:

1. The method of removal of irregularities and highly defected areas from the surface of crystals and epitaxial layers GaN and GaAlInN by mechano-chemical polishing characterized by polishing on soft pad under pressure with the presence of chemical etching agent of water solution of bases of the concentration exceeding 0.01N during more than 10 second, and then replacing the etching agent by pure water and polishing by at least 1 minute and then diminution of the pressure and stopping the polishing machine, the polished GaN crystal and epitaxial GaAlInN layer is removed of the polishing machine and dried in the stream of dry nitrogen.

2. The procedure according to claim 1 wherein the base is a member selected from the group consisting of sodium hydroxide NaOH, potassium hydroxide KOH and mixtures thereof.

3. The procedure according to claim 1 with the polishing in the presence of chemical etching agent and pure water using the angular velocity equal to 1 to 100 revolutions per minute.

4. The procedure according to claim 1 with the polishing with the adding of chemical etching agent on polishing pad with the rate of 1–5 droplets per second.

5. The procedure according to claim 1 with the polishing with the adding of pure water on polishing pad with the rate over 1 droplets per second.

6. The procedure according to claim 1 wherein the polishing of the nominal crystal surface is performed under a pressure of higher than 0.1 Mpa.

* * * * *